(12) United States Patent
Shiba et al.

(10) Patent No.: US 8,008,654 B2
(45) Date of Patent: Aug. 30, 2011

(54) THIN-FILM TRANSISTOR DEVICE AND A METHOD FOR MANUFACTURING THE SAME

(75) Inventors: Takeo Shiba, Kodaira (JP); Tomihiro Hashizume, Hatoyama (JP); Yuji Suwa, Kokubunji (JP); Tadashi Arai, Kumagaya (JP)

(73) Assignee: Hitachi, Ltd., Tokyo (JP)

( * ) Notice: Subject to any disclaimer, the term of this patent is extended or adjusted under 35 U.S.C. 154(b) by 455 days.

(21) Appl. No.: 12/155,801

(22) Filed: Jun. 10, 2008

(65) Prior Publication Data
US 2009/0001361 A1    Jan. 1, 2009

(30) Foreign Application Priority Data

Jun. 18, 2007    (JP) .................................. 2007-160621

(51) Int. Cl.
*H01L 51/00*    (2006.01)
(52) U.S. Cl. .................................. 257/40; 257/E51.001
(58) Field of Classification Search .................. 257/40, 257/E51.001
See application file for complete search history.

(56) References Cited

U.S. PATENT DOCUMENTS

| | | | |
|---|---|---|---|
| 6,335,539 B1 | 1/2002 | Dimitrakopoulos et al. | |
| 6,905,906 B2 | 6/2005 | Sirringhaus et al. | |
| 7,622,734 B2 * | 11/2009 | Suwa et al. .................... | 257/40 |
| 2003/0089905 A1 * | 5/2003 | Udagawa et al. .............. | 257/40 |
| 2004/0161873 A1 | 8/2004 | Dimitrakopoulos et al. | |
| 2004/0185600 A1 | 9/2004 | Kagan et al. | |
| 2005/0208400 A1 | 11/2005 | Nishikawa et al. | |
| 2008/0012009 A1 | 1/2008 | Hashizume et al. | |

FOREIGN PATENT DOCUMENTS

| | | |
|---|---|---|
| JP | 2002-134694 | 4/2004 |
| JP | 2004-134694 | 4/2004 |
| JP | 2006-269709 | 10/2006 |
| WO | WO 2005/069401 | 7/2005 |

OTHER PUBLICATIONS

Vusser et al., "A 2V Organic Complementary Inverter", ISSCC (International Solid-State Circuit Conference) 2006, Session 15.7, Proceeding, p. 282 (2006).
T. Yasuda et al., "Recent Progress and Future Prospect of Organic Semiconductorfor Field—Effect Transistors", Applied Physics, vol. 74, No. 9, p. 1196 (2005).

(Continued)

*Primary Examiner* — Eugene Lee
*Assistant Examiner* — Anthony Ho
(74) *Attorney, Agent, or Firm* — Antonelli, Terry, Stout & Kraus, LLP.

(57) ABSTRACT

A method of manufacturing a thin-film transistor device improves performance of a complementary TFT circuit incorporated in a thin- and light-weighted image display device or a flexible electronic device, and reduces power consumption manufacturing cost. Electrodes forming n-type and p-type TFTs and an organic semiconductor are made of the same material in both types of TFT by a solution-process and/or printable process method. A first polarizable thin-film is formed on an interface between a gate insulator and a semiconductor, and a second polarizable thin film provided on an interface between source and drain electrodes and the semiconductor film. A complementary thin-film transistor device is manufactured by selectively exposing either the n-type TFT area or the p-type TFT area to light to remove the polarizing function from the first and second polarizable thin films.

13 Claims, 10 Drawing Sheets

OTHER PUBLICATIONS

Vusser et al., "A 2V Organic Complementary Inverter", Applied Physics, vol. 74, No. 9, p. 1196 (2005).

T. Yasuda et al., "Recent Progress and Future Prospect of Organic Semiconductorfor Field—Effect Transistors", ISSCC (International Solid-State Circuit Conference) 2006, Session 15.7, Proceeding, p. 282 (2006).

Extended European Search Report in EP Appln. 08010391.4—1226/ 2006929, dated Apr. 20, 2011, (11 pages). [in English].

Ye, Tao et al; 'Photoreactivity of Alkylsiloxane Self-Assembled Monolayers on Silicone Oxide Surfaces,' Langmuir, vol. 17, No. 15, May 9, 2001, pp. 4497-4500.

Chua, Lay-Lay et al; 'General Observation of n-type Field-Effect Behaviour in Organic Semiconductors,' Nature, Nature Publishing Group, London, Great Britain, vol. 1 434, No. 7030, Mar. 10, 2005, pp. 194-199.

* cited by examiner

BACK EXPOSURE

BACK EXPOSURE

| CHEMICAL FORMULA 10 | CHEMICAL FORMULA 11 | CHEMICAL FORMULA 12 |
|---|---|---|
|  |  |  |

THIN-FILM TRANSISTOR DEVICE AND A METHOD FOR MANUFACTURING THE SAME

CLAIM OF PRIORITY

The present application claims priority from Japanese patent application JP 2007-160621 filed on Jun. 18, 2007, the content of which is hereby incorporated by reference into this application.

BACKGROUND OF THE INVENTION

1. Field of the Invention

The present invention relates to a method of manufacturing a thin-film transistor device and a thin-film transistor device. More specifically, the invention relates to a thin-film transistor device and a method of manufacturing a thin-film transistor device which enables reduction in manufacturing cost and is excellent in thin and light-weight characteristics, impact resistance as well as flexibility. This method advantageously is suitable for a transistor integrated circuit substrate or an active matrix image display device.

2. Description of the Related Art

As a first example of the related art, a thin-film transistor (referred to as TFT hereinafter) which uses an organic semiconductor and an active matrix image display device to which the thin-film transistor is applied have been disclosed in Patent documents 1 and 2. According to these publications, coating and printing technique is used for manufacturing thin-film transistors, in which it possible to manufacture TFTs at a low temperature with low cost on a substrate such as a plastic substrate having flexibility.

As a second example of the related art, for instance, Non-patent documents 1 and 2 include detailed descriptions concerning ambipolar transistors or complementary TFTs each based on an organic semiconductor. In these known examples, it is possible to configure the complementary TFT circuit by using the p-type TFT in which an electric charge is transferred through a hole and the n-type TFT in which electrons transfer an electric charge, which enables manufacture of low power consuming and more sophisticated integrated circuits.

Patent document 1: JP-A-2004-134694
Patent document 2: U.S. Pat. No. 6,905,906
Non-patent document 1: Applied Physics, vol. 74, No. 9, p. 1196 (2005)
Non-patent document 2: ISSCC (International Solid-State Circuit Conference) 2006, Session 15.7, Proceeding, p. 282 (2006)

SUMMARY OF THE INVENTION

There are strong needs and higher expectation for realization of the so-called flexible devices such as a display device which is excellent in thin and light-weight characteristics, impact resistance, transportability, and easiness in accommodation; a card with the identification function; an image display device or an electronic label with an integrated circuit which can be mounted on a curved surface; and wearable matrix sensor used in a curved fashion.

Because such devices have a relatively large area with the edge length of several centimeters to several tens centimeters and are additionally mounted on for use a card or a label produced by the conventional printing technique, it is necessary to reduce the manufacturing cost per unit area. A technique on a transistor substrate required for realization of devices capable of satisfying the needs as described above is associated with an organic thin-film transistor belonging to the first example of the related art described above; however, the organic thin-film transistor is based on a single channel, and cannot be used for configuring a complementary circuit. Therefore this technique cannot satisfy the needs for reduction in power consumption or for realization of sophisticated devices.

In the case of the complementary TFT circuit belonging to the second example of the related art described above, because different semiconductor materials are used for the n-type TFT and the p-type TFT, film formation and machining for the materials, and patterning are required to be carried out separately according to each material, and the production process is complicated. As a result, it is difficult to simplify the production process and to reduce the manufacturing cost with this technique.

The present invention has been made to solve the problems described above, and an object of the present invention is to provide a method of manufacturing a thin-film transistor in which film formation, machining, and patterning need not be performed independently according to the materials used for the n-type and p-type TFTs and also the n-type and p-type complementary thin-film transistors are formed using the same semiconductor material.

Another object of the present invention is to provide a method of manufacturing a thin-film transistor in which simplification of the manufacturing process and reduction in the manufacturing cost can be achieved. It is a still another object of the present invention to provide a method of manufacturing a thin-film transistor in which a high performance and low power-consuming complementary TFT can be configured and also reduction in power consumption and functional sophistication can be attained to thereby realize a high performance and low power consuming complementary organic TFT circuit device.

The present invention has been made to solve the problems described above, and one of a representative example of a method of manufacturing a thin-film transistor according to the present invention is as described below. That is, a method of manufacturing a thin-film transistor comprises the steps of:

forming a gate electrode;
forming a gate insulator on the gate electrode;
making source and drain electrodes for both an n-type TFT and a p-type TFT of the same material by self-alignment of the source and drain electrodes to the gate electrode; and
forming first and second polarizable thin films, after formation of the gate electrode, the gate insulator, and the source and drain electrodes, on each of the gate insulator, the source electrode, and the drain electrode;
wherein an area of either the n-type TFT or the p-type TFT is selectively exposed to light to remove the polarizing function from the first and second polarizable thin films including in the exposed area, and then a semiconductor film for forming a channel is made of the same material for both the n-type TFT and the p-type TFT.

The present invention also provides a thin-film transistor device comprising:

an n-type TFT; and
a p-type TFT;
wherein a semiconductor film for forming a channel is made of the same material for both the n-type TFT and the p-type TFT;
source and drain electrodes in the n-type TFT and the p-type TFT are made of the same material; and
either one or both of the n-type TFT and the p-type TFT have a first polarizable thin film on an interface between a gate insulator and a semiconductor and also have a second polarizable thin film on an interface between the source and drain electrodes and the semiconductor film.

The polarizable thin film is a self-assemble monolayer (SAM) film, and the polarizable thin films are provided so that orientations and/or difference in potential of dipole vectors generated due to polarization are different in the n-type TFT and p-type TFT. Further the first polarizable thin film is made of molecules having a silane coupling group and a polarized group, and the silane coupling group adheres to the gate insulator surface comprising a Si oxide film or a metal oxide film. The second polarizable thin film is made of molecules having an SH group and the polarized group, and the SH group adheres to surfaces of the source and drain electrodes. In this case, orientations of the dipole vectors generated due to polarization are substantially perpendicular to the surfaces of the gate insulator and the electrodes.

With the present invention, it is possible to provide an electronic device having a high performance and low power-consuming complementary TF circuit, especially a thin and light-weighted image display device or a flexible electronic device with the RF-ID function. Furthermore, the present invention reduces the number of steps in manufacture of the electronic devices, so that reduction in the manufacturing cost is achieved and mass production by printing and production of large size appliances are facilitated.

DETAILED DESCRIPTION OF THE PREFERRED EMBODIMENTS

In first and second embodiments of the present invention described below, a complementary TFT is directly formed by the solution-process and/or printable process method on a transparent plastic substrate, and a semiconductor film, a gate insulator, and electrodes for each of the n-type TFT and the p-type TFT are made of the same material. In addition, polarizable SMA films are each provided on an interface between the gate insulator and the semiconductor film as well as on an interface between the source/drain electrodes and the semiconductor. With the configuration, an energy level is control, namely a threshold value Vth is controlled by making use of a dipole generated by polarization to efficiently perform induction and injection of carrier into a channel area in both the n-type and p-type TFTs, thereby improving the performance, and furthermore an overlap capacitance between the gate electrode and the source/drain electrodes is reduced by self-alignment. Furthermore, in a third embodiment of the present invention described below, specific examples of the SAM film materials having polarizability or photosensitivity are shown by the chemical formulae, and a complementary TFT comprising a semiconductor, a gate insulator, and electrodes, all of which are made of the same material, is easily manufactured by the manufacturing method based on selective exposure to light.

First Embodiment

A first embodiment of the present invention is described with reference to FIGS. 1 to 10. This embodiment relates to an example of a thin film transistor formed by the solution-process and/or printable process method, for instance, on a flexible substrate in which a complementary TFT circuit is configured with a p-type TFT and an n-type TFT. The examples of circuits provided in this embodiment are a signal generator including a ring oscillator and a NAND circuit. The complementary TFT circuit as represented by the circuits operates with low power consumption, and can provide various functions or systems.

Figure 2A:
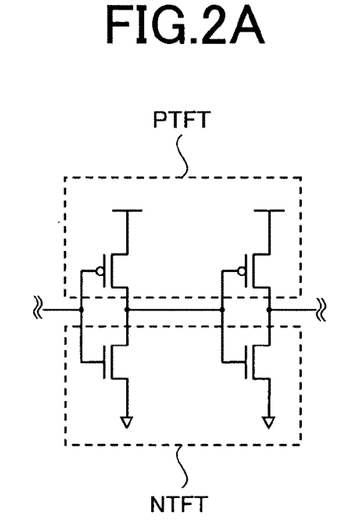
FIG. 2A is a circuit diagram illustrating the complementary thin-film transistor according to the first embodiment.
Figure 2B:
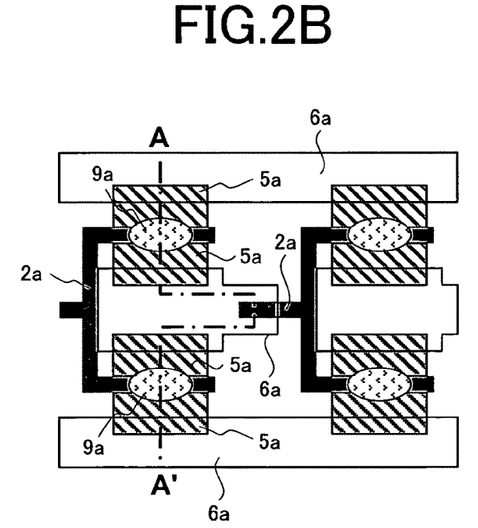
FIG. 2B is a schematic plan view illustrating the complementary thin-film transistor according to the first embodiment.
Figure 3A:
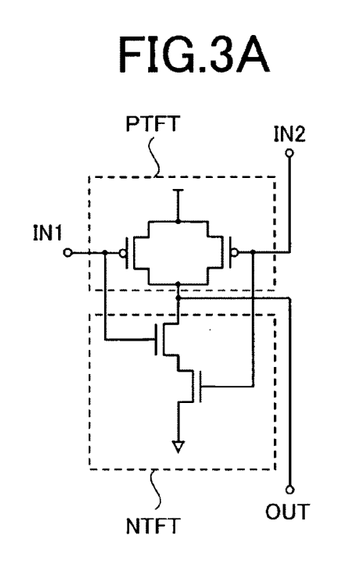
FIG. 3A is a circuit diagram illustrating the complementary thin-film transistor according to the first embodiment.
Figure 3B:
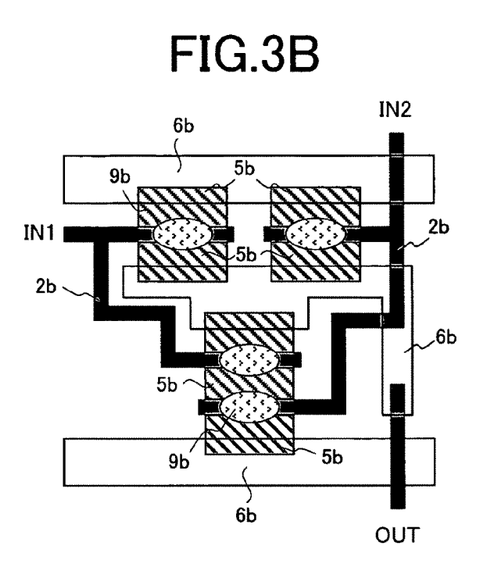
FIG. 3B is a schematic plan view illustrating the complementary thin-film transistor according to the first embodiment.

The ring oscillator has a plurality of complementary TFT invertors connected in multiple stages. FIG. 2A is a circuit diagram showing two stages of the invertors, and FIG. 2B is a plan view showing the layout. The NAND circuit shown in FIG. 3 is one of basic logic circuits required to constitute an electronic computer. FIG. 3A is a circuit diagram illustrating a two-input complementary NAND gate, and in the figure IN1 and IN2 each denote an input terminal, while OUT denotes an output terminal. FIG. 3B is a plan view illustrating the layout.

Figure 1:
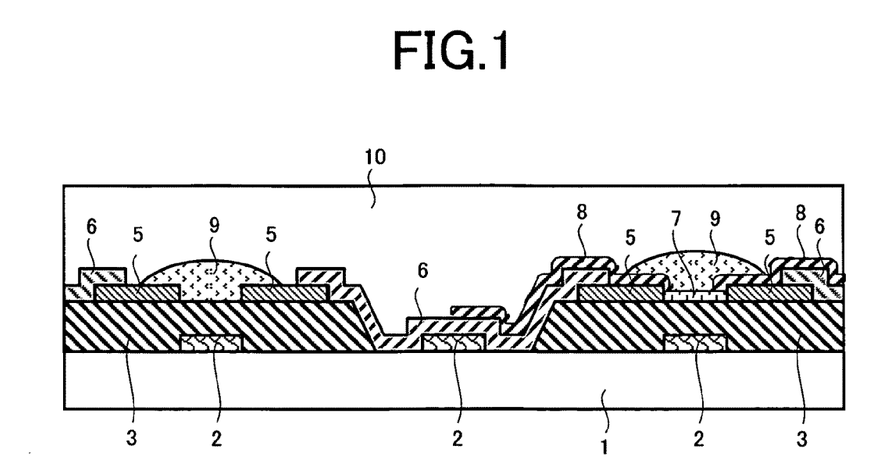
FIG. 1 is a view illustrating a cross-sectional structure of a complementary thin-film transistor according to a first embodiment of the present invention.

FIG. 1 is a view illustrating a cross-sectional structure of a TFT in a portion taken along the line A-A' in FIG. 2B, and in this embodiment, and the TFT in the left side of FIG. 1 is a p-type organic TFT, while the TFT in the right side is an n-type organic TFT. FIGS. 4 to 10 are cross-sectional views illustrating the steps of manufacturing the organic TFTs.

At first, the cross-sectional structure of the thin-film transistor device is described with reference to FIG. 1. A flexible plastic-made substrate 1 is used as a TFT substrate, for instance. The substrate 1 is thin and light-weighted and can be bent with a curvature radius of about 1 cm or below. A p-type organic TFT and an n-type organic TFT are formed on this plastic substrate 1, for instance, by the solution-process and/or printable process method. A gate electrode 2, a gate insulator 3, source/drain electrodes 5, and an organic substrate 9, which constitute the p-type organic TFT and the n-type organic TFT, are made of the same material in both of the p-type organic TFT and the n-type organic TFT.

In this embodiment, a material for the gate electrode 2 is a metal ink, a material for the gate insulator 3 is a soluble Si oxide film, a material for the source/drain electrodes 5 is a soluble Au electrode, and a material for the organic semiconductor 9 is soluble pentacene. When the combination of the materials described above is employed, in the p-type organic TFT, an absolute value of Vth (a threshold value for turning ON the TFT) depending on a work function of the gate electrode and an electron affinity of pentacene is as low as about 1 V or below, which is very low. In addition, a Schottky barrier to holes on an interface between the Au electrode and pentacene is low, and an electric charge can easily be injected through the holes from the Au electrode to pentacene when the gate voltage is set to a desired threshold value Vth.

On the other hand, because the threshold value Vth becomes higher in principle when the combination of materials described above is employed, the n-type organic TFT is set such that the polarizable thin film 7 is provided on an interface between the gate insulator 3 and the organic semiconductor 9 to decrease the absolute value of the threshold value Vth to about 1 V or below. A potential difference of the dipole vector generated in association with polarization is about 1.5 V, and an orientation of the vector is from the gate insulator 3 to the organic semiconductor 9 and a potential in the gate insulator 3 is negative, while that in the semiconductor is positive. Namely the orientation is substantially perpendicular to the interface.

With the configuration described above, when a potential difference between the gate electrode and the source electrode is set to a threshold value required for turning ON the n-type TFT, electrodes are efficiently induced in a channel area on the interface between the gate insulator 3 and the organic semiconductor 9. In addition, because the Schottky barrier to electrons on the interface between the Au electrode and pentacene is high, the polarizable thin film 8 is provided on an interface between the source/drain electrodes 5 and the organic semiconductor 9 to decrease the Schottky barrier. In this step, the dipole vector generated due to polarization has an orientation from the Au electrode to the organic semiconductor 9, that is, a potential in the Au electrode is negative and that in the semiconductor is positive. The orientation is substantially perpendicular to the interface.

With the configuration described above, when a potential difference between the gate electrode and the source electrode is set to a value desired for turning ON the n-type TFT, electrons are easily injected from the Au electrode to the semiconductor 9.

In this embodiment, a combination of materials is employed in which a threshold value Vth for the p-type TFT is low and the Schottky barrier to holes from the source/drain electrodes to the semiconductor is low. However, it is possible to employ a combination of materials in which the threshold value Vth in the n-type TFT is low and the Schottky barrier to electrons from the source/drain electrodes to the semiconductor is low. In this case, the same effect can be achieved also when a polarizable thin film is provided on the p-type TFT so that an orientation of the dipole vector generated due to polarization is reversed.

Alternatively, polarizable thin films are each provided on the p-type and n-type TFTs so that the orientation of the dipole vector is from the organic semiconductor 9 to the gate insulator 3 or to the source/drain electrodes 5 in the p-type TFT and is from the gate insulator 3 or the source/drain electrodes 5 to the organic semiconductor 9 in the n-type TFT. Thus, induction or injection of a carrier into the channel area can be made more efficient in the respective TFTs.

The circuit configuration is shown in FIGS. 1 to 3. Especially, in FIG. 2A and FIG. 3A, the p-type TFT is represented by a broken line area denoted by the sign PTFT and the n-type TFT is represented by a broken line area denoted by the sign NTFT. As shown in the figures, gate electrodes 2, 2a, and 2b in both of the p-type and n-type TFTs are connected to each other. The source/drain electrodes 5, 5a, and 5b are provided independently around the p-type TFT and the n-type TFT respectively, and are connected to each other via separate printing interconnection layers 6, 6a, and 6b respectively.

Also the gate electrodes 2, 2a, 2b are connected to the source/drain electrodes 5, 5a, 5b via the printed interconnection layers 6, 6a, and 6b respectively, and a cross-sectional structure of the connecting portion is as shown in FIG. 1. In this way, providing the interconnection layers separately from the source/drain electrode simultaneously achieves improved performance of a TFT and reduction of resistance in an interconnection layer for circuit connection.

In this embodiment, patterning is performed so that channel lengths of the p-type and n-type TFTs are, for instance, about 4 μm or below, and the semiconductor material is designed and film formation is performed so that the field effect transfer rate in the TFT is 1 $cm^2$/Vs or more. Furthermore a parasitic capacitance caused by overlapping between the gate and the source/drain electrodes is reduced to zero, so that a propagation delay time per one stage of an inverter without load can be reduced to about 5 n seconds. Furthermore, for instance, the ring oscillator can be operated with an oscillation frequency of about 50 MHz.

Figure 4:
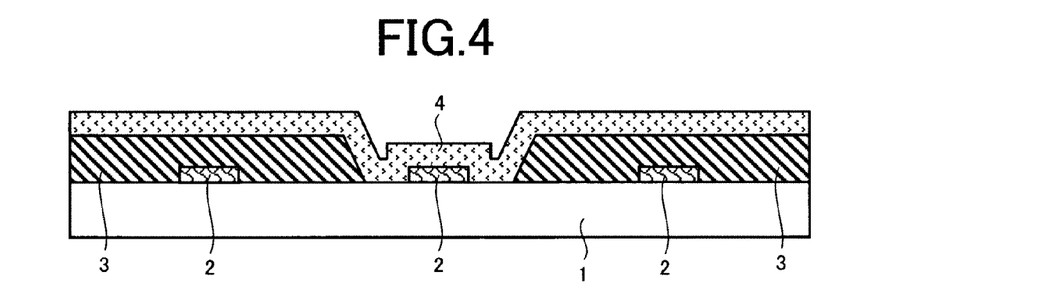
FIG. 4 is a view illustrating a cross-sectional structure the complementary thin-film transistor according to the first embodiment during the manufacturing process.
Figure 8:
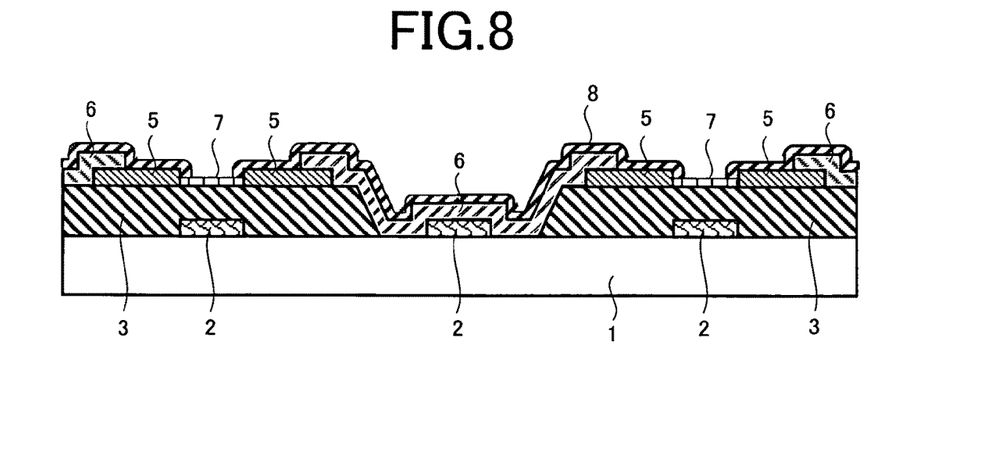
FIG. 8 is a view illustrating a cross-sectional structure of the complementary thin-film transistor according to the first embodiment during the manufacturing process.
Figure 9:
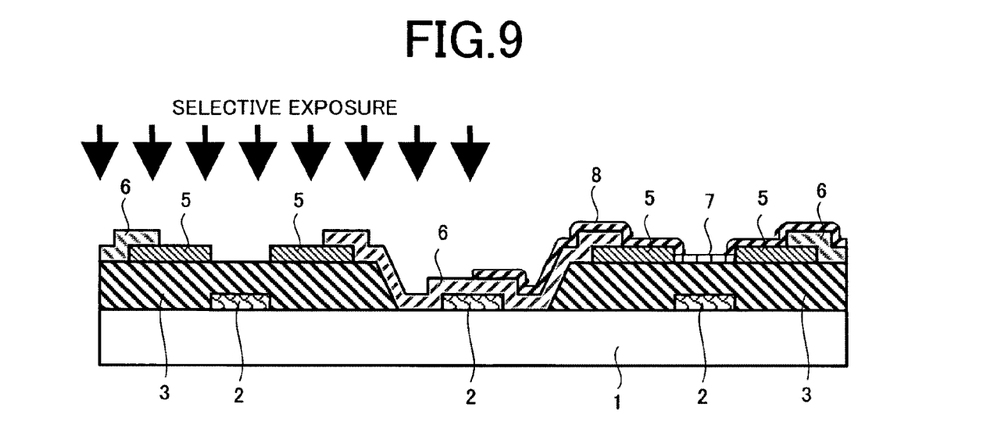
FIG. 9 is a view illustrating a cross-sectional structure of the complementary thin-film transistor according to the first embodiment during the manufacturing process.
Figure 10:
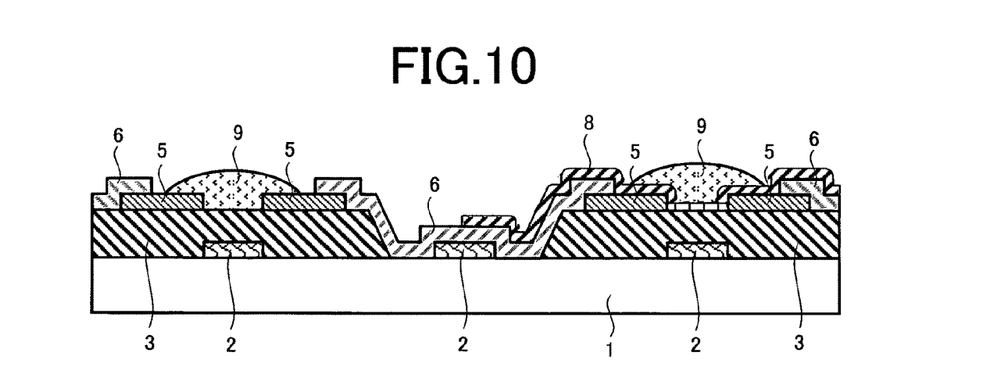
FIG. 10 is a view illustrating a cross-sectional structure of the complementary thin-film transistor according to the first embodiment during the manufacturing process.

Next, a process of manufacturing a complementary TFT and a method of manufacturing a TFT, and a cross-sectional structure of the TFT are described with reference to FIG. 4 10 showing cross-sections of the TFT taken along the line A-A' in FIG. 2B according to the manufacturing steps. For the organic semiconductor TFT, a complementary TFT is directly formed on a plastic substrate having low heat resistance with the temperature in all steps kept at 200° C. or below by using the solution process and/or printable process method.

Step 1: At first, as shown in FIG. 4, the gate electrode 2 is formed on the transparent plastic substrate 1 using a metal ink material by means of print patterning, then, for instance, the soluble oxide film 3 is coated thereon, and a connecting section is opened. The Si oxide film 3 may partially be applied. Then a hydrophobic resist film 4 is applied.

Figure 5:
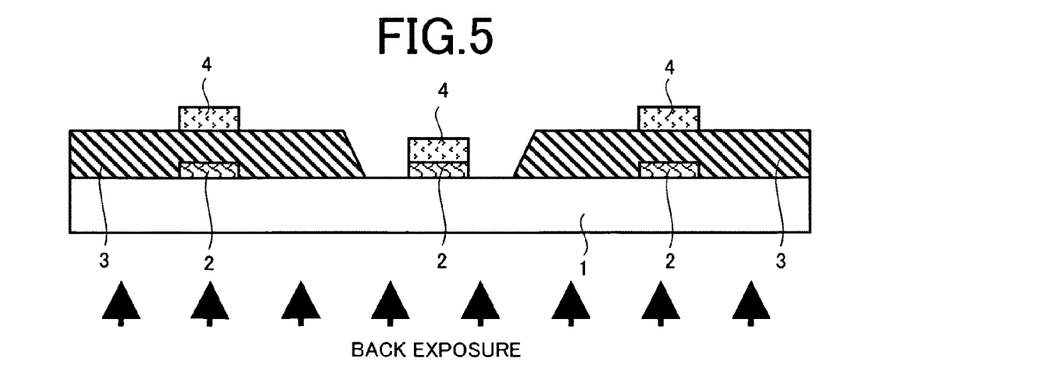
FIG. 5 is a view illustrating a cross-sectional structure of the complementary thin-film transistor according to the first embodiment during the manufacturing process.

Step 2: Then, as shown in FIG. 5, the transparent substrate 1 is exposed to light from a rear surface thereof and developed to provide a pattern of the hydrophobic resist film 4. In this step, the gate electrode 2 functions as a light-shielding mask, portions of the resist 4 remain above the gate electrode 2, and the resist 4 other than the areas remained is removed.

Figure 6:
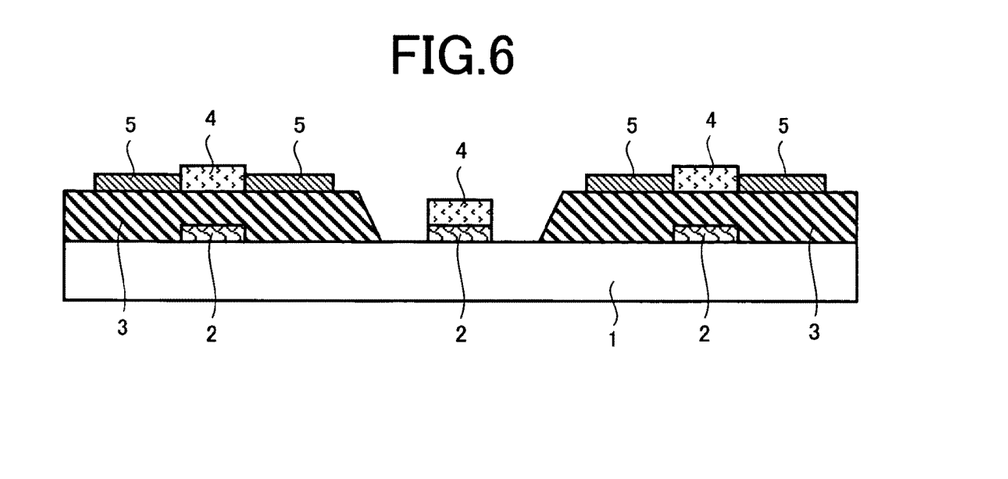
FIG. 6 is a view illustrating a cross-sectional structure of the complementary thin-film transistor according to the first embodiment during the manufacturing process.

Step 3: Next, as shown in FIG. 6, the source/drain electrode 5 is selectively applied by the print patterning technique using a metal ink such as an Au ink. In this step, because the resist film is hydrophobic, the metal ink material is not applied on the resist film 4. Therefore, positions of the source/drain electrodes 5 are self-aligned to the gate electrode 2, thus suppressing overlapping capacitance between the two electrodes.

Figure 7:
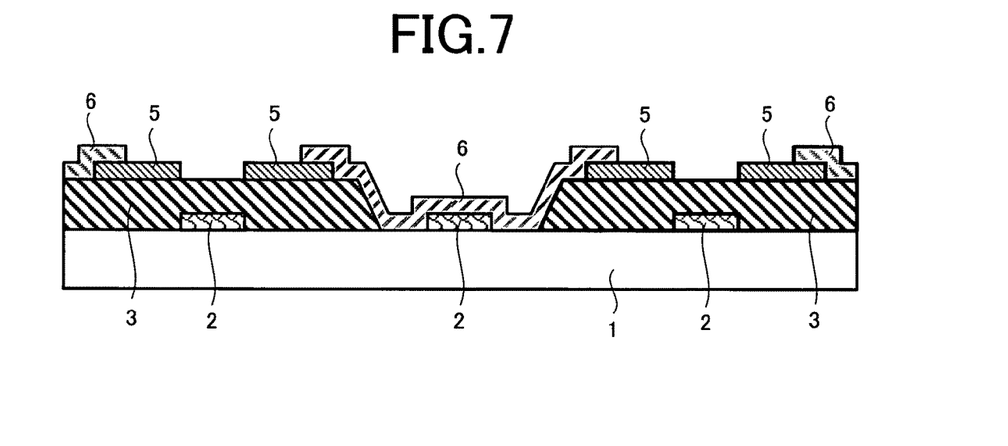
FIG. 7 is a view illustrating a cross-sectional structure to the complementary thin-film transistor according to the first embodiment during the manufacturing process.

Step 4: Next, as shown in FIG. 7, after the hydrophobic resist film 4 is removed, the interconnection layer 6 is formed by print patterning, and the gate electrode 2 and the source/drain electrodes 5 are connected to each other, and connection between electrodes required for forming a circuit is performed.

Step 5: Then, as shown in FIG. 8, a first polarizable thin film 7 is applied. Because this polarizable thin film 7 has a silane coupling group adhering to a Si oxide film, the polarizable thin film 7 is selectively applied onto the Si oxide film 3.

Step 6: Then, a second polarizable thin film 8 is applied. Because this second polarizable thin film 8 has an SH group adhering to a metal electrode, the polarizable thin film 8 is selectively applied to the source/drain electrode 5 and to the interconnection layer 6. In this embodiment, the first polarizable thin film 7 and the second polarizable thin film 8 are applied sequentially; however but even when the materials are mixed together and are applied all at once, the materials may selectively be applied on the source/drain electrodes 5 and the interconnection layer 6.

Figure 14:
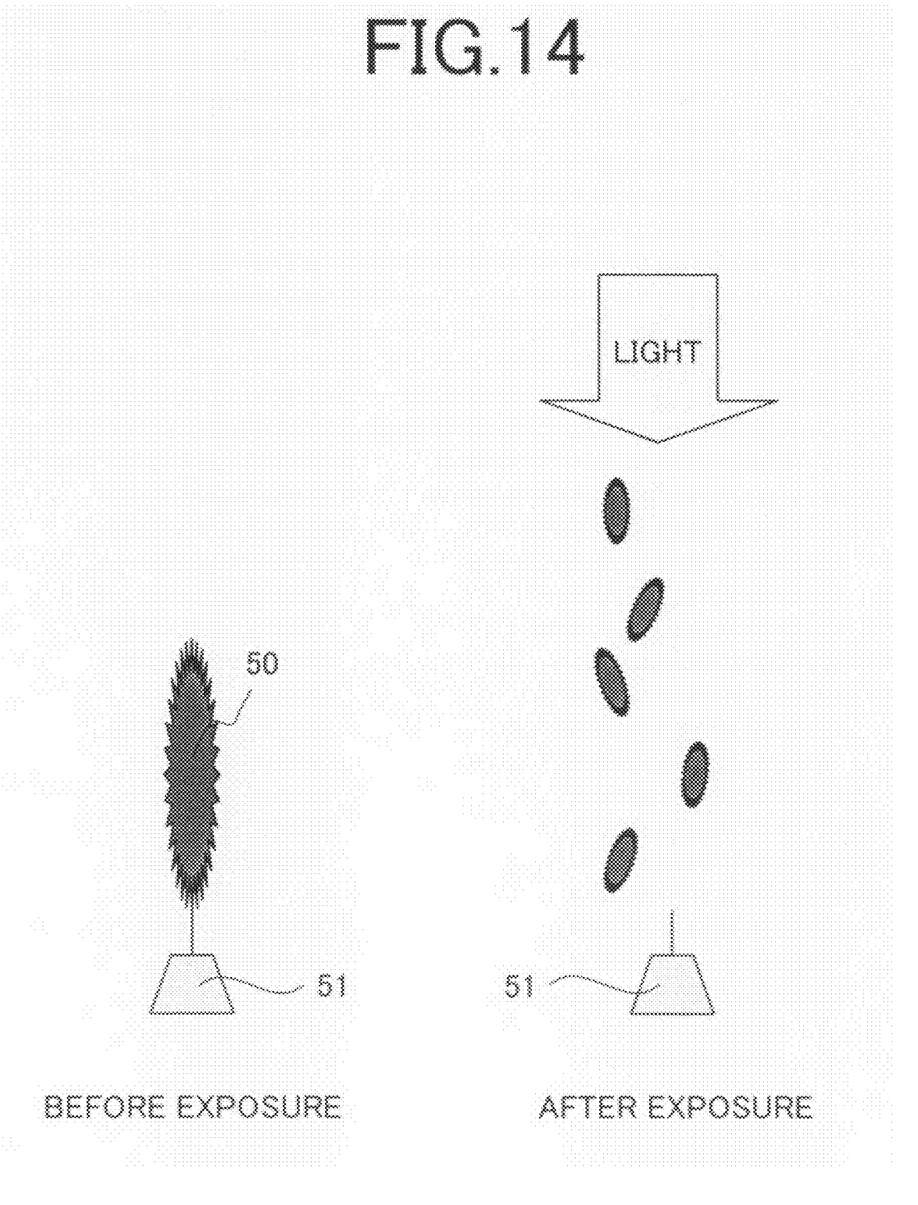
FIG. 14 is a conceptual diagram illustrating dismount and removal of a polarized group upon exposure.

Step 7: Next, as shown in FIG. 9, only the p-type TFT area is selectively exposed to UV rays by the lithography technique using a photomask, or by the direct exposure technique not requiring the photomask. With this operation, the first and second polarizable thin film materials are decomposed, and the polarizing property is removed from the p-type TFT area. Decomposition and removal of the polarized group in this step are conceptually shown in FIG. 14, and a polarized group 50 is decomposed and removed by UV rays. In FIG. 14, reference numeral 50 denotes a polarized group, and 51 denotes a silane coupling group. FIG. 14 schematically shows the situation in which the polarized group 50 is decomposed after exposure to light.

Step 8: Next, as shown in FIG. 10, the organic TFT channel 9 such as soluble pentacene is selectively applied to only an area to be formed into a channel of the organic TFT by print-patterning.

Step 9: Finally, as shown in FIG. 1, a passivation film 10 comprising, for instance, an organic high-molecular-weight material is applied, and a desired area is selectively opened to complete a thin film transistor comprising a complementary TFT circuit. It is to be noted that the passivation film 10 may selectively be applied, for instance, by print-patterning.

The effects provided in this embodiment are as follows. In the conventional technique adopted for manufacturing a complementary organic TFT device, because different types of semiconductors or electrode materials are used for the p-type TFT and the n-type TFT, it has been required to separately perform film formation, machining, and patterning for each TFT. This increases the number of manufacturing steps, and the manufacturing process is complicated. However, in this embodiment, the same material is used for any of a gate insulator, an electrode, and a semiconductor in both of the TFTs, which makes it possible to simplify the manufacturing process. Further, in both of the p-type and n-type TFTs, a carrier can efficiently be induced and injected in the channel areas when the circuit is turned ON, which leads to improvement in the performance.

Furthermore, when the self-alignment method is employed which allows overlapping between the gate electrode 2 and the source/drain electrodes 5 to be suppressed like in this embodiment, it is possible to avoid decrease of the precision in alignment, which is encountered in the solution process and/or printable process method. As a result, it is possible to provide a high-performance and low power consumption complementary organic TFT circuit device with small overlapping between the gate electrode 2 and the source/drain electrodes 5.

When the complementary organic TFT circuit device is applied, it is possible to realize a low power consumption display device such as the so-called electronic book which can be bent like a paper sheet during reading or viewing of a color picture, a low power consumption printed electronic tag having the function sometimes referred to as RF-ID (Radio Frequency Identification), a flexible card having the RF-ID function, an electronic product label having the RF-ID function, a wearable flexible sensor, and the like.

Although the plastic substrate 1 used in this embodiment may be made of, for instance, polyethylene telephthalate, polyethylene naphthalate, polycarbonate, polyimide, the present invention is not limited to such a plastic substrate. For instance, a metal foil substrate may be used in the present invention. Metal inks such as an Ag ink or an Au ink, conductive organic materials, and transparent materials for electrodes may be used as materials for the electrodes 2, 5, and 6. The solution-process and/or printable process methods, which may be used in the present invention, include the typical methods such as the ink jet method, the offset printing method, the electrophotographic printing method, and the dispenser method, or the plating method.

The gate insulator 3 which may be used in the present invention is not limited to the soluble Si oxide film employed in the embodiment described above, and it is possible to use a solution-processed high permitivity metal oxide film, an organic polymer insulator, and the like. As the solution-processed organic semiconductor material 9, it is possible to use low molecular organic materials such as pentacene or a derivative thereof, or polphyrin; and high molecular organic materials such as P3HT (polythiophene) and F8T2 (polyfluoren thiophene copolymer). Furthermore, it is possible to use solution-processed materials such as solution-processed Si or a solution-processed oxide semiconductor. The polarizable SMA film may be used for forming the polarizable thin films 7, 8.

As described above, in this embodiment, the materials and the manufacturing steps may be modified without spoiling the gist of the present invention. Furthermore, the TFT structure is not limited to that described above. For instance, the configuration shown in FIG. 1 may be modified to the top gate structure in which the gate electrode 2 for the FTF is above the semiconductor layer 9. Although the description of the present embodiment is based on the self-alignment method using solution-process and/or printable process method as a method of manufacturing an organic TFT, the present invention is not limited to this technique. It is needless to say that the effects of the present invention can be achieved even if vacuum film deposition such as deposition and sputtering is combined with a patterning method such as photolithography or etching to form organic TFTs, electrodes, or interconnections.

Second Embodiment

A second embodiment of the present invention is described with reference to FIGS. 11 to 13, and FIG. 7. The second embodiment exemplifies a tin-film transistor device on which the same complementary TFT circuit as that in the first embodiment is configured. In the second embodiment, the manufacturing steps 1 to 3 in the first embodiment shown in FIGS. 4 to 6 are replaced with those shown in FIGS. 11 to 13, and other manufacturing steps or the cross-sectional structure of the completed device as shown in FIG. 1 are the same as those in the first embodiment.

Outlines of the replaced steps are as described below.

Figure 11:
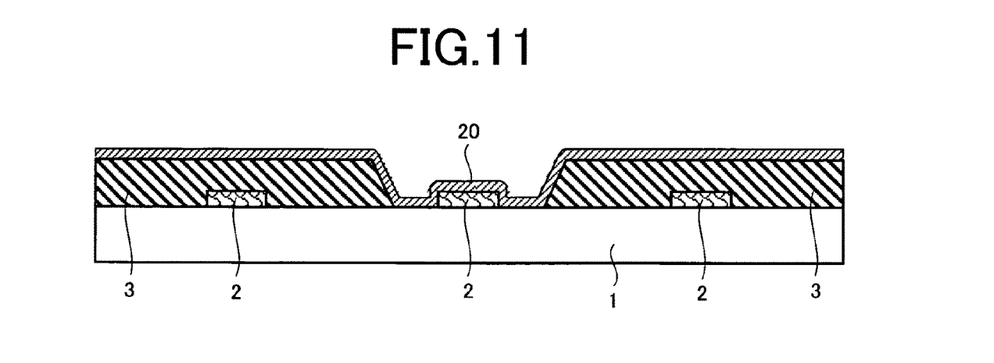
FIG. 11 is a view illustrating a cross-sectional structure of the complementary thin-film transistor according to a second first embodiment during the manufacturing process.

Specifically, as shown in FIG. 11, the steps of forming the gate electrode 2 on the transparent plastic substrate 1 using a metal ink material by the print-patterning method and applying the Si oxide film 3 to provide an opening for connection are the same as the steps 1 in the first embodiment.

Then, a photo-sensitive SAM film, from which the hydrophobic group withdraws when exposed to light with a wavelength of 350 nm or more, is applied on the substrate 1.

Figure 12:
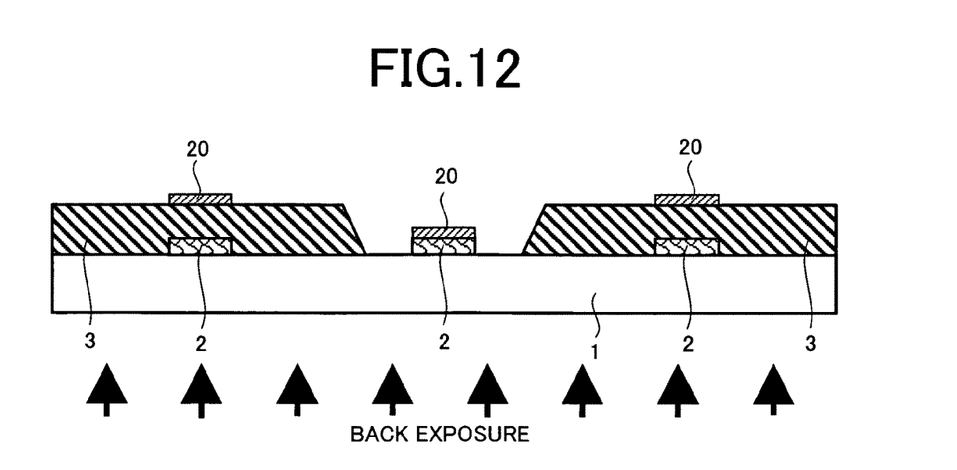
FIG. 12 is a view illustrating a cross-sectional structure of the complementary thin-film transistor according to the second first embodiment during the manufacturing process.

Then, as shown in FIG. 12, the transparent substrate 1 is exposed to light from a rear surface thereof, and post treatment such as base treatment based on rinsing with a solution of tetramethyl ammonium hydroxide or cleaning with pure water is carried out.

While the rear surface of the substrate 1 is exposed to light, the gate electrode 2 functions as a light-shielding mask, and a hydrophobic group remains in the photo-sensitive SAM film 20 above the gate electrode 20. The hydrophobic group withdraws from areas of the other photo-sensitive SAM film 20.

Figure 13:
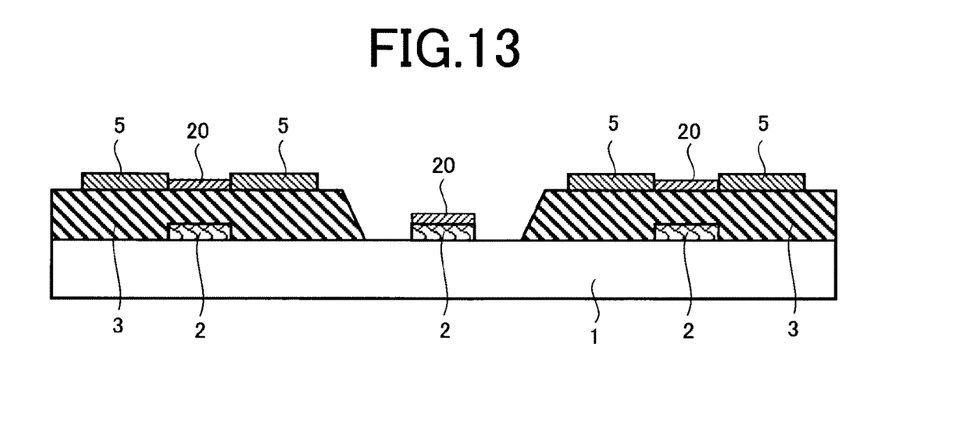
FIG. 13 is a view illustrating a cross-sectional structure of the complementary thin-film transistor according to the second first embodiment during the manufacturing process.

Next, as shown in FIG. 13, a metal ink such as Au is selectively applied to the source/drain electrodes 5, for instance, by print-patterning. In this time, because the photo-sensitive SMA film 20 is hydrophobic, the metal ink material is not applied on the photo-sensitive film 20. Therefore, positions of the source/drain electrodes 5 are self-aligned to the gate electrode 2, thereby suppressing overlap between the two electrodes.

Then, the entire surface of the substrate is performed to remove all of the remaining hydrophobic groups in the photo-sensitive SAM film 20 so that the interconnection layer 6 is formed by print-patterning as shown in FIG. 7. Then, connection between the gate electrodes 2 and the source/drain electrodes 5 or other connections required for forming a circuit are carried out.

The subsequent manufacturing steps are the same as the steps 5 to 9 described in the first embodiment.

Also in this embodiment, a high performance and low power consumption complementary organic TFT can be realized based on the self-aligning solution-process and/or printable process method by using the same material for both types of TFTs. Therefore, the same effect as that in the first embodiment can be provided.

Third Embodiment

Figure 19:
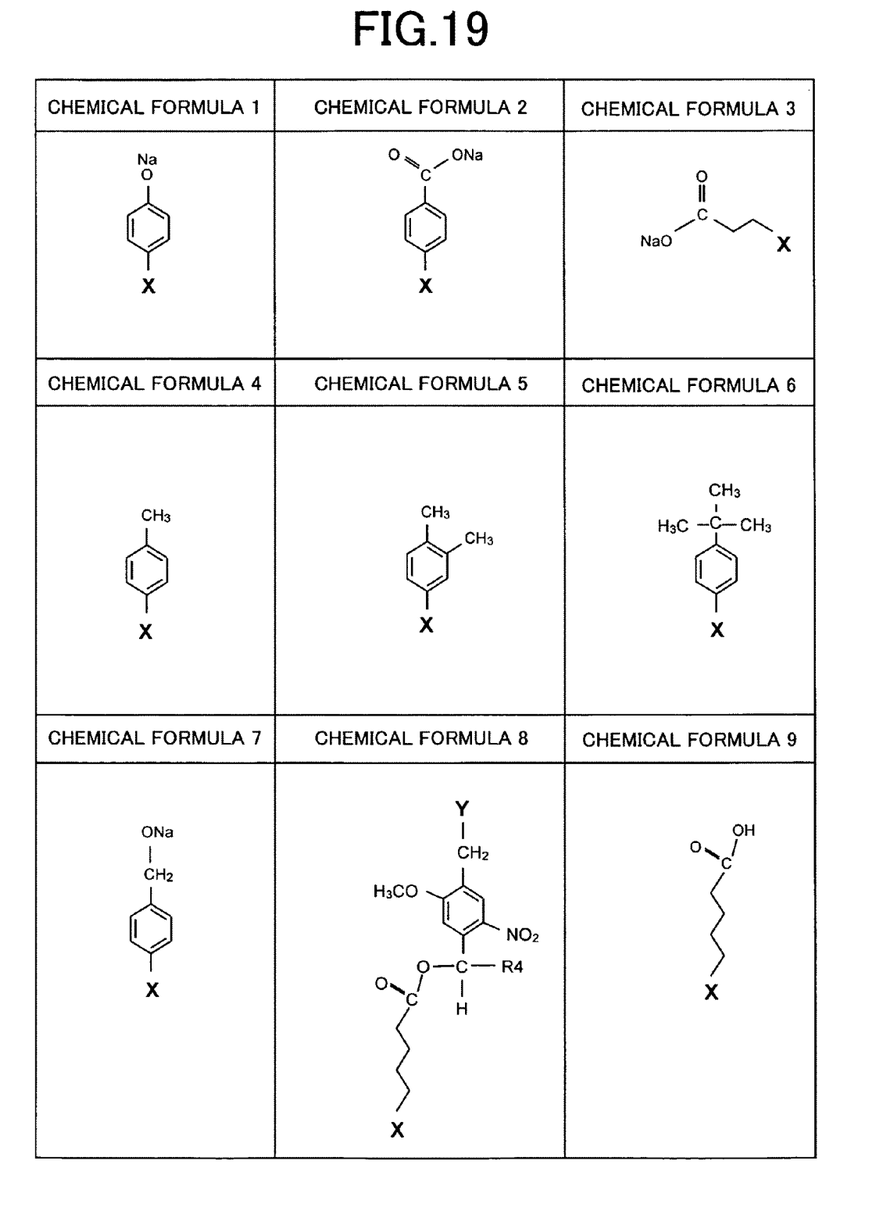
FIG. 19 is a view showing a list of chemical formulae of polarizable thin film materials used in the first embodiment.
Figure 20:
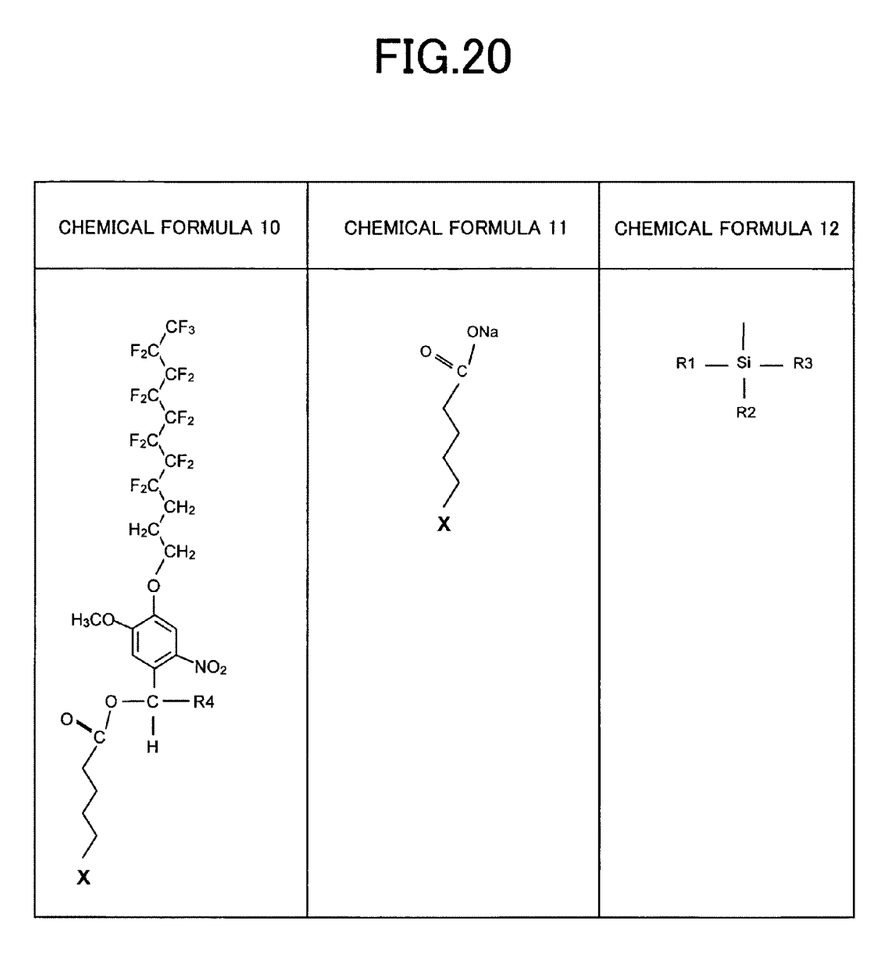
FIG. 20 is a view showing a list of chemical formulae of polarizable thin film materials used in the first embodiment.

A third embodiment of the present invention is described with reference to chemical formulae 1 to 9 shown in FIG. 19 and chemical formulae 10 to 12 shown in FIG. 20. In this embodiment, example of materials for the polarizable thin films 7, 8 used in the first embodiment are shown with the chemical formulae.

Chemical formulae 1 to 7 represent examples of polarizable SAM material generating a dipole vector from the gate insulator 3 (for instance, Si oxide film) or the source/drain electrodes 5 to the organic semiconductor in the n-type TFT. In the chemical formulae, X denotes an SH group or a silane coupling group expressed by chemical formula 12. R1, R2, and R3 in chemical formula 12 denote an $OCH_3$ group, an $OCH_2CH_3$ group or an OH group, or CL (chlorine). The polarizable thin film material adheres to electrodes when X is an SH group, and generates a dipole vector from the source/drain electrode to the organic semiconductor 9. When X is a silane coupling group, the thin film material adheres to the gate oxide film, and generates a dipole vector from the gate oxide film to the organic semiconductor.

Chemical formula 8 represents an example of a polarizable SAM material based on photo-sensitive carboxylic acid, and X denotes an SH group or the silane coupling group expressed by chemical formula 12. Y is any of the polarized groups expressed by chemical formulae 1 to 7. R4 denotes a carbon hydride. When the material is applied for manufacture of a complementary TFT device, the manufacturing process is as follows.

At first, the source/drain electrodes 5 and the interconnection layer 6 are formed following the same manufacturing steps as steps 1 to 4 in the first embodiment shown in FIGS. 4 to 7.

Next, as shown in FIG. 8, a first polarizable SAM film having a silane coupling group expressed by X in chemical formula 8 is selectively applied on the Si oxide film 3.

Then, a second polarizable SAM film 8 having an SH group denoted by X in chemical formula 8 is selectively applied on the source/drain electrodes 5 as well as on the interconnection layer 6.

Then, as shown in FIG. 9, the post treatment such as exposure to light with a wavelength of 350 nm or more, rinsing with a developer, and cleaning with pure water is performed selectively only to the p-type TFT area by the photolithography using a photo mask or direct exposure method not requiring the photo mask.

Figure 15:
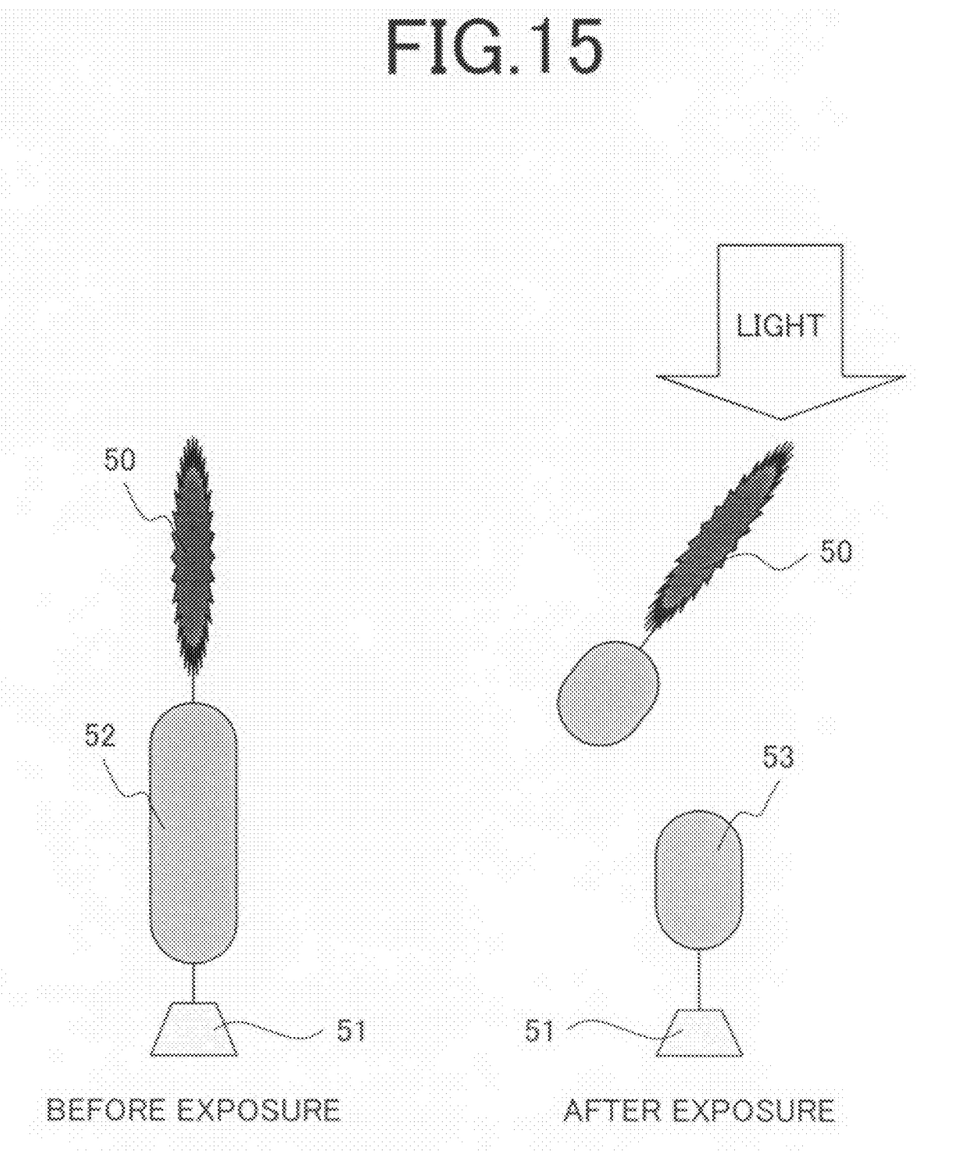
FIG. 15 is a conceptual diagram illustrating disengagement of a polarized group upon exposure.

With the operations as described above, molecular components having the polarized group Y expressed by chemical formula 8 withdraw from the first and second polarizable SAM film materials to provide the molecular structure expressed by chemical formula 9, and the polarizing function is removed form the p-type TFT area. Change of the molecular structure caused by exposure to light in this process is conceptually shown in FIG. 15. Because a photo-sensitive area 52 is decomposed and removed by exposure to light, the polarized group 50 withdraws, and the hydrophilic group 53 used for improving the wettability remains in the p-type TFT. The subsequent manufacturing steps are the same as steps 7 and 8 described in the first embodiment.

Also in this embodiment, a high performance complementary organic TFT can be realized based on the self-aligning solution-process and/or printable process method with the simplified manufacturing process by using the same material for both the p-type TFT and the n-type TFT. Therefore, the same effects as those provided in the first embodiment can be achieved also in this embodiment. In this embodiment, carboxylic acid is used as a photo-sensitive polarizable SAM material, but the same effect can be achieved even by use of photo-sensitive polarizable SAM material of sulphonic acid type.

Chemical formula 10 represents an example of the photo-sensitive SAM material of carboxylic acid type having a fluorine-based hydrophobic group. In the formula, X denotes the same SH group or the silane coupling group expressed by chemical formula 12. When the material is applied to manufacture of a complementary TFT device, the manufacturing method is as follows.

Specifically, the source/drain electrodes 5 and the interconnection layer 6 are formed following the same manufacturing step as those shown in FIGS. 4 to 7 (steps 1 to 4) in the first embodiment.

Figure 16:
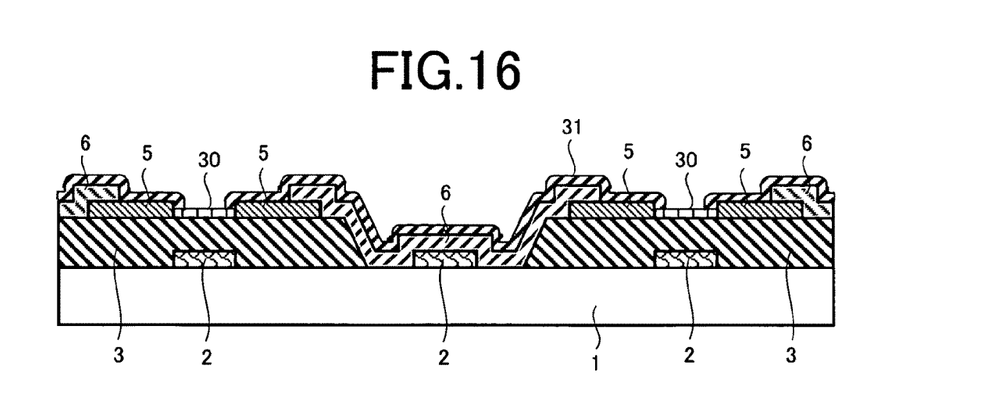
FIG. 16 is a view illustrating a cross-sectional structure of the complementary thin-film transistor according to a third embodiment during the manufacturing process.

Then, as shown in FIG. 16, a first polarizable SAM film 30 having a silane coupling group as expressed by X in chemical formula 10 is selectively applied to the Si oxide film 3.

Then, a second polarizable SAM film 31 having a SH group denoted by X in chemical formula 10 is selectively applied to the source/drain electrodes 5 and the interconnection layer 6.

Figure 17:
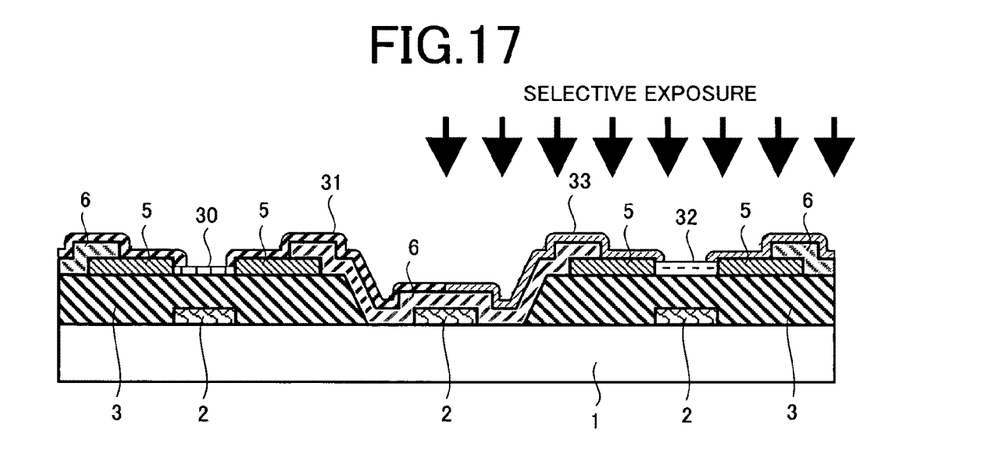
FIG. 17 is a view illustrating a cross-sectional structure of the complementary thin-film transistor according to the third embodiment during the manufacturing process.

Then, as shown in FIG. 17, only the n-type TFT is exposed to light having a wavelength of 350 nm by the lithography using a photomask or by the photolithography not requiring a photomask.

Then rinsing is performed with an NaOH solution with a concentration of about 5%.

With the operations described above, molecular components containing a hydrophobic group withdraw from the first and second photo-sensitive SAM film materials in the n-type TFT area, and furthermore, when H is replaced with Na, the photo-sensitive SAM film materials are converted to polarizable SAM film materials 32, 33 expressed by chemical formula 11. On the other hand, the photo-sensitive SAM films 30, 31 having a hydrophobic group expressed by chemical formula 10 remain in the p-type TFT area.

Figure 18:
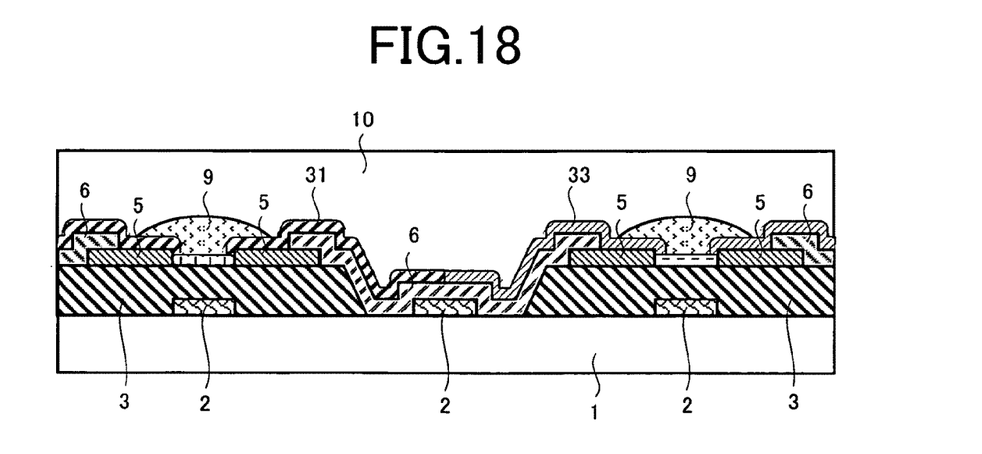
FIG. 18 is a view illustrating a cross-sectional structure of the complementary thin-film transistor according to the third embodiment during the manufacturing process.

Then, as shown in FIG. 18, the organic semiconductor film 9 such as solution-processed pentacene is selectively applied to an area to be formed as a channel on the organic TFT by print-patterning, and a protective film 10 made of, for instance, a high-molecular-weight material is applied. Then, a desired area is selectively opened to complete a thin film transistor device including a complementary TFT circuit.

Also in this embodiment, a high performance organic TFT can easily be realized based on self-aligning solution-process and/or printable process method with the simplified manufacturing process by using the same material for both of the p-type and n-type TFTs. Furthermore, the photo-sensitive SAM films 30, 31 expressed by chemical formula 10 and still remaining in the p-type TFT area is subjected to polarization due to an action by F to provide a dipole vector from the organic semiconductor film 9 to the gate insulator 3 or to the source/drain electrodes 5. Because of the feature, as compared to a case where there is no SAM film, induction and injection of a carrier through holes into the channel area can be carried more efficiently. Furthermore, the polarizable SAM films 32, 33 expressed by chemical formula 11, which is formed in the n-type TFT area, have a dipole vector based on polarization from the gate insulator 3 or from the source drain electrode 5 to the organic semiconductor 9. This allows induction and injection of electrons to the channel area to be performed efficiently.

As described above, with the present invention, the performance can be improved in both of the n-type and p-type TFTs. In this embodiment, although a photo-sensitive hydrophobic SAM film material of carboxylic acid type is used, the same effects can be achieved even by use of a photo-sensitive hydrophobic SAM film material of sulphonic acid type.

1: Plastic substrate
2, 2a, 2b: Gate electrode
3: Gate insulator (Gate oxide film)
4: Hydrophobic resist film
5, 5a, 5b: Source/drain electrodes
6, 6a, 6b: interconnection layer
7: First polarizable thin film
8: Second polarizable thin film
9, 9a, 9b: organic semiconductor
10: Protective film
20: Photo-sensitive SMA film
30, 31: Photo-sensitive hydrophobic SAM film
32, 33: Polarizable SAM film
50: Polarized group
51: Group adhering to electrode or oxide film
52: Photo-sensitive portion
53: Residual group after exposure (hydrophilic group)

What is claimed is:

1. The thin-film transistor device comprising:
   an n-type TFT; and
   a p-type TFT;
   wherein a semiconductor film for forming a channel is made of the same material for both the n-type TFT and the p-type TFT;
   source and drain electrodes in the n-type TFT and the p-type TFT are made of the same material; and
   either one or both of the n-type TFT and the p-type TFT have a first polarizable thin film on an interface between a gate insulator and a semiconductor and also have a second polarizable thin film on an interface between the source and drain electrodes and the semiconductor film,
   wherein the polarizable thin films are provided so that orientations and/or difference in potential of dipole vectors generated due to polarization are different in the n-type TFT and p-type TFT.

2. The thin-film transistor device according to claim 1, wherein the semiconductor film is an organic semiconductor.

3. The thin-film transistor device according to claim 1, wherein the first and second polarizable thin films are SAM films.

4. The thin-film transistor device according to claim 1, wherein the n-type TFT and the p-type TFT form a complementary circuit.

5. The thin-film transistor comprising:
   an n-type TFT; and
   a p-type TFT;
   wherein a semiconductor film for forming a channel is made of the same material for both the n-type TFT and the p-type TFT;
   source and drain electrodes in the n-type TFT and the p-type TFT are made of the same material; and
   either one or both of the n-type TFT and the p-type TFT have a first polarizable thin film on an interface between a gate insulator and a semiconductor and also have a second polarizable thin film on an interface between the source and drain electrodes and the semiconductor film,
   wherein the first polarizable thin film is made of molecules having a silane coupling group and a polarized group, the silane coupling group adheres to a surface of the gate insulator comprising an Si oxide film or a metal oxide film, and an orientation of the dipole vector generated due to polarization is substantially perpendicular to the surface of the gate insulator.

6. The thin-film transistor device according to claim 5, wherein the semiconductor film is an organic semiconductor.

7. The thin-film transistor device according to claim 5, wherein the first and second polarizable thin films are SAM films.

8. The thin-film transistor device according to claim 5, wherein the n-type TFT and the p-type TFT form a complementary circuit.

9. The thin-film transistor device comprising:
an n-type TFT; and
a p-type TFT;
wherein a semiconductor film for forming a channel is made of the same material for both the n-type TFT and the p-type TFT;
source and drain electrodes in the n-type TFT and the p-type TFT are made of the same material; and
either one or both of the n-type TFT and the p-type TFT have a first polarizable thin film on an interface between a gate insulator and a semiconductor and also have a second polarizable thin film on an interface between the source and drain electrodes and the semiconductor film,
wherein the second polarizable thin film is made of molecules each having an SH group and the polarized group, the SH group adheres to surfaces of the source electrode and drain electrodes, and an orientation of the dipole vector generated due to polarization is substantially perpendicular to the surfaces of the electrodes.

10. The thin-film transistor device according to claim 9, wherein the semiconductor film is an organic semiconductor.

11. The thin-film transistor device according to claim 9, wherein the first and second polarizable thin films are SAM films.

12. The thin-film transistor device according to claim 9, wherein the n-type TFT and the p-type TFT form a complementary circuit.

13. A thin-film transistor device comprising:
a gate electrode;
a gate insulator formed on the gate electrode;
an n-type TFT; and
a p-type TFT;
wherein source and drain electrodes for both the n-type TFT and the p-type TFT are comprised of the same material by self-alignment of the source and drain electrodes to the gate electrode;
wherein the first and second polarizable thin films are formed on each of the gate insulator, the source and drain electrode, after the gate electrode, the gate insulator, and the source and drain electrodes are formed;
wherein a semiconductor film for forming a channel is comprised of the same material for both the n-type TFT and the p-type TFT, after an area of either the n-type TFT or the p-type TFT is selectively exposed to light to remove the polarizing function from the first and second polarizable thin-films including in the exposed area; and
wherein the polarizable thin films are configured so that orientations and/or difference in potential of dipole vectors generated due to polarization are different in the n-type and p-type TFT.

* * * * *